(12) United States Patent
Takano

(10) Patent No.: US 6,449,704 B1
(45) Date of Patent: Sep. 10, 2002

(54) MEMORY FAILURE ANALYSIS DEVICE THAT RECORDS WHICH REGIONS HAVE AT LEAST ONE DEFECT

(75) Inventor: Katsuhiko Takano, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/340,047

(22) Filed: Jun. 28, 1999

(30) Foreign Application Priority Data

Jun. 26, 1998 (JP) ............................................ 10-180211

(51) Int. Cl.⁷ ............................................... G06F 12/00
(52) U.S. Cl. ....................................... 711/173; 714/723
(58) Field of Search ........................... 711/173; 714/723

(56) References Cited

U.S. PATENT DOCUMENTS

| | | | | |
|---|---|---|---|---|
| 4,479,214 A | * | 10/1984 | Ryan ........................... | 714/702 |
| 6,081,463 A | * | 6/2000 | Shaffer et al. ............... | 365/200 |
| 6,175,939 B1 | * | 1/2001 | Dinteman .................... | 714/724 |

* cited by examiner

Primary Examiner—Kevin Verbrugge
(74) Attorney, Agent, or Firm—Rosenthal & Osha L.L.P.

(57) ABSTRACT

A memory device testing apparatus transfers at high speed a fail signal from a failure analysis memory unit 100 to a memory failure remedy analysis unit 200. The failure analysis memory unit 100 has a data storage memory 110 and a compact memory 120. The data storage memory 110 is divided into at least two sub address spaces. The divided sub address spaces are assigned to the addresses in the compact memory 120. An address generation control unit reads data stored in the compact memory 120. An address generation unit 132 generates a memory address signal 143 based on a sub address signal 141 and a detail address signal 142. The detail address signal 142 is incremented by the address generation control unit 125. The data in the sub address space storing the fail signal is transferred to the memory failure remedy analysis unit 200. If the data read from the compact memory 120 does not contain failure information, the data stored in the corresponding sub address space is not transferred.

10 Claims, 6 Drawing Sheets

MEMORY FAILURE ANALYSIS DEVICE THAT RECORDS WHICH REGIONS HAVE AT LEAST ONE DEFECT

BACKGROUND OF THE INVENTION

1. Field of the Invention

The present invention relates to a technique for transferring data from a memory, and more particularly to a data transfer technique used for a memory device testing apparatus.

2. Description of Related Art

FIG. 1 shows a conventional configuration for transferring a fail signal stored in a failure analysis memory unit 10 to a memory failure remedy analysis unit 30 in a memory device testing apparatus to remedy a fail memory device.

The failure analysis memory unit 10 has a data storage memory 12, an address generation control unit 14, an address pointer 16, a multiplexer 18, and a data storage memory register 20. The memory failure remedy analysis unit 30 has a fail buffer memory 34 and an address pointer 36. When a defective cell is present in the memory device, a fail signal 91 which indicates the content of the failure is stored in an address in the data storage memory that corresponds to the address signal 65 of the defective cell of the test memory device. The address signal 65 passes through the input terminal on the 0-side of the multiplexer 18 and is input to the data storage memory 12. The data storage memory 12 has the same memory capacity as the memory device being tested.

The address pointer 16 outputs an address signal incremented by a clock signal. The address signal generated by the address pointer 16 passes through the input terminal on the 1-side of the multiplexer 18, and is input to the address pin of the data storage memory 12. In this case, a read request signal is input to the control pin of the data storage memory 12. As a result, the data containing the fail signal stored in the data storage memory 12 is read and transferred by the memory failure remedy analysis unit 30.

The address pointer 36 o f the memory failure remedy analysis unit 30 receives substantially the same clock signal as the clock signal input to the address pointer 16. The address pointer 36 generates an address signal that accesses the fail buffer memory 34. This address signal is incremented by a click signal. The address signal generated by the address pointer 36 and the transfer data signal 22 output from the data storage memory 12 a re input in synchronization to the fail buffer memory 34. A write request signal is input to the control pin of the fail buffer memory 34. The transfer data signal 22 is written onto the address designated by the address signal input from the address pointer 36 to the fail buffer memory 34. The data storage memory register 20 stores the value of the end address of the data storage memory 12. The address generation control unit 14 compares the value incremented by the address pointer 36 with the value stored in the data storage memory register 20. When the value incremented by the address pointer 36 agrees with the value stored in the data storage memory register 20, all the data inside the data storage memory 12 is transferred. In this case, the transfer operation is completed. After this, the address pointers 16 and 36 are reset and returned to the initial states.

In t he conventional configuration shown in FIG. 1, regardless of the number of defective cells, all the data in the data storage memory 12 from the start address to the end address must be transferred. For example, when i t takes Tread (sec) to read the data stored in 1 address and the address of the test memory device has the length of 64M words, it takes 64M×Tread (sec) to transfer all the data stored in the data storage memory 12. Hence, as the capacity of the test memory device such as a DRAM, SDRAM or the like is increased, the length of time required to transfer all the data from the failure analysis memory unit 10 to the memory failure remedy analysis unit 30 is increased accordingly.

SUMMARY OF THE INVENTION

In order to solve the above-stated problem, the present invention provides a data transfer apparatus which transfers data from a data storage memory that can be divided into at least two sub-address spaces. This data transfer apparatus has a compact memory for storing transfer data existence information which indicates whether transfer data to be transferred exists or not in each of the sub address spaces, a sub memory address designation unit for generating a sub address signal that designates the sub address space having the transfer data based on an output from the compact memory, and a read address control unit which reads and transfers the transfer data stored in the sub address space indicated by the sub address signal output from the sub memory address designation unit.

The pre sent invention also provides a memory device testing apparatus for testing a memory device. This memory device testing apparatus has a pattern generator which generates a control signal for controlling the memory device, an address signal for accessing said memory device, and a test data signal for representing test data to be written on the memory device, a memory device plug-in unit which enables test data to be written on the memory device and the test data to be read from the memory device by having the memory device plugged in and supplying the control signal and the address signal generated by the pattern generator to the memory device, a comparison device which compares expectation value data equal to the test data supplied to the memory device to be written on the memory device with the test data that has been read after being written on the memory device, and outputs a fail signal that indicates the content of a defect when the memory device has a defective spot, a failure analysis memory unit having a data storage memory that is divided into at least two sub address spaces including an address that corresponds to the address of the defective spot of the memory device onto which the fail signal output from the comparison device is written, and a compact memory which stores failure information that indicates existence of said defective spot in the sub address space, and a memory failure remedy analysis unit to which the fail signal written on the data storage memory is transferred. Based on the failure information stored in the compact memory, the fail signal written on the sub address space in which the defective spot exists is transferred to the memory failure remedy analysis unit.

Moreover, the present invention also provides a data transfer method for transferring data from a data storage memory divisible into at least two sub address spaces. This data transfer method has the first step of storing in a compact memory having a memory capacity smaller than a memory capacity of the data storage memory transfer data existence information which indicates whether transfer data to be transferred exists or not in each of said sub address spaces, the second step of generating a sub address signal for designating the sub address space in which the transfer data is stored based on the transfer data existence information stored in the compact memory, and the third step of reading and transferring the transfer data stored in the sub address space designated by the generated sub address signal.

Moreover, the present invention also provides a memory device testing method for testing a memory device using a data storage memory that is divided into at least two sub address spaces. This memory device testing method has the first step of having a pattern generator generate a control signal for controlling the memory device, an address signal for accessing the memory device, and a test data signal for representing test data to be written on the memory device, the second step of writing test data on the memory device by supplying the control signal and the address signal generated by the pattern generator to the memory device, the third step of comparing expectation value data identical to the test data supplied to the memory device to be written on the memory device with the test data that has been read after being written on the memory device, and outputting a fail signal for indicating content of a defect when the memory device has a defective spot, the fourth step of writing the fail signal onto an address in the data storage memory that corresponds to the address of the defective spot in said memory device, the fifth step of writing failure information, which indicates that the defective spot exists in the sub address space, onto a compact memory having a memory capacity smaller than a memory capacity of the data storage memory, and the sixth step of transferring the fail signal written on the sub address space having the defective spot based on the failure information.

DETAILED DESCRIPTION OF THE INVENTION

Figure 2:
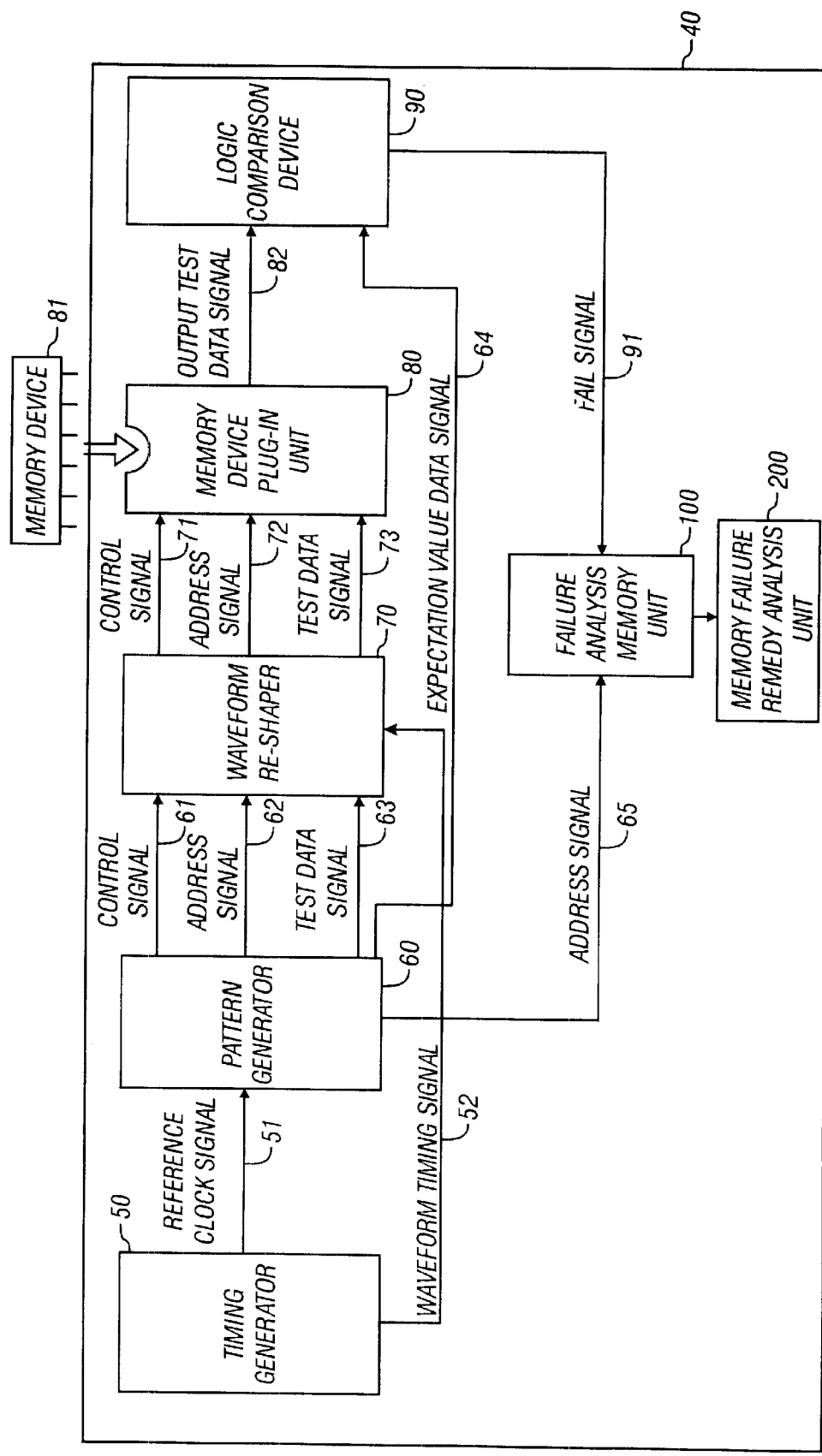
FIG. 2 is a block diagram showing the entire structure of the memory device testing apparatus 40.

FIG. 2 shows a memory device testing apparatus 40 which performs a failure analysis of a test memory device 81. This memory device testing apparatus 40 has a timing generator 50, a pattern generator 60, a waveform re-shaper 70, a memory device plug-in unit 80, a logic comparison device 90, a failure analysis memory unit 100, and a memory failure remedy analysis unit 200.

In accordance with the reference clock signal 51 generated by the timing generator 50, the pattern generator 60 generates a control signal 61 which requests the test memory device 81 to write data, an address signal 62 for accessing the test memory device 81, and a test data signal 63 which represents the test data to be written on the test memory device 81. The control signal 61 generated by the pattern generator 60, the address signal 62, and the test data signal 63 are input to the waveform re-shaper 70. The waveform re-shaper 70 re-shapes the waveforms of the control signal 61, the address signal 62, and the test data signal, respectively, based on the waveform timing signal 52 generated by the timing generator 50 so as to conform to the characteristic of the test memory device 81. The waveform re-shaper 70 outputs a control signal 71, an address signal 72, and a test data signal 73, whose waveforms have been re-shaped, to the memory device plug-in unit 80.

The control signal 71 and the address signal 72, which are written request signals, are input to the control pin and address pin of the memory device 81 plugged into the memory device plug-in unit 80, respectively. The test data signal 73 is written onto the memory device 81 from the data input-output pin of the memory device 81. The waveform re-shaper 70 determines the timings at which the control signal 71, the address signal 72, and the test data signal 73 are input to the memory device 81.

After the test data signal 73 has been written, the pattern generator 60 generates a control signal 61 which requests data to be read and an address signal 62. The waveform re-shaper 70 re-shapes the waveforms of the generated control signal 61 and the address signal 62, respectively. The waveform-reshaped control signal 71 and address signal 72 are then input from the memory device plug-in unit 80 to the control pin and address pin of the memory device 81, respectively. The memory device 81 outputs an output test data signal 82 to the logic comparison device 90 based on the input control signal 71 and address signal 72.

When the output test data signal 82 is output to the logic comparison device 90, an expected value data signal 64 generated by the pattern generator 60 is simultaneously output to the logic comparison device 90. This expected value data signal 64 has the same signal pattern as the test data signal 73 written on the memory device 81. The logic comparison device 90 compares the output test data signal 82 with the expected value data signal 64. If these signals match, then the logic comparison device 90 judges that the test memory device 81 is non-defective. Otherwise, the logic comparison device 90 judges that the test memory device 81 is defective. The logic comparison device 90 is an exclusive logic sum circuit. If the value of the output test data signal 82 differs from the value of the expected value data signal 64, the logic comparison device 90 outputs a fail signal "1".

In recent years, memory devices having a large capacity and a high degree of integration have been developed. If the entire memory device having a large capacity and a high degree of integration is judged to be defective even when there is only one defective cell in the memory device, a high productivity (yield) cannot be achieved. Therefore, there is a system which provides a superfluous configuration for the memory device so that a defective cell can be replaced with a spare memory cell. According to this system, when there is a defective cell in the memory device, the defective cell is replaced with a non-defective cell in the manufacturing process of the memory device to produce a non-defective memory device. For this purpose, a memory failure remedy analysis unit 200 is installed in the memory device testing apparatus 40. The memory failure remedy analysis unit 200 searches for the address of the defective cell in the memory device, and seeks a remedy solution to determine with which spare cell the detected defected cell should be replaced.

When the test memory device 81 is defective, the fail signal 91 output from the logic comparison device 90 is written on the address in the failure analysis memory unit 100 designated by the address signal 65. The fail signal 91 written on the failure analysis memory unit 100 is transferred to the memory failure remedy analysis unit 200. The memory failure remedy analysis unit 200 then finds the above-described remedy solution.

Figure 1:
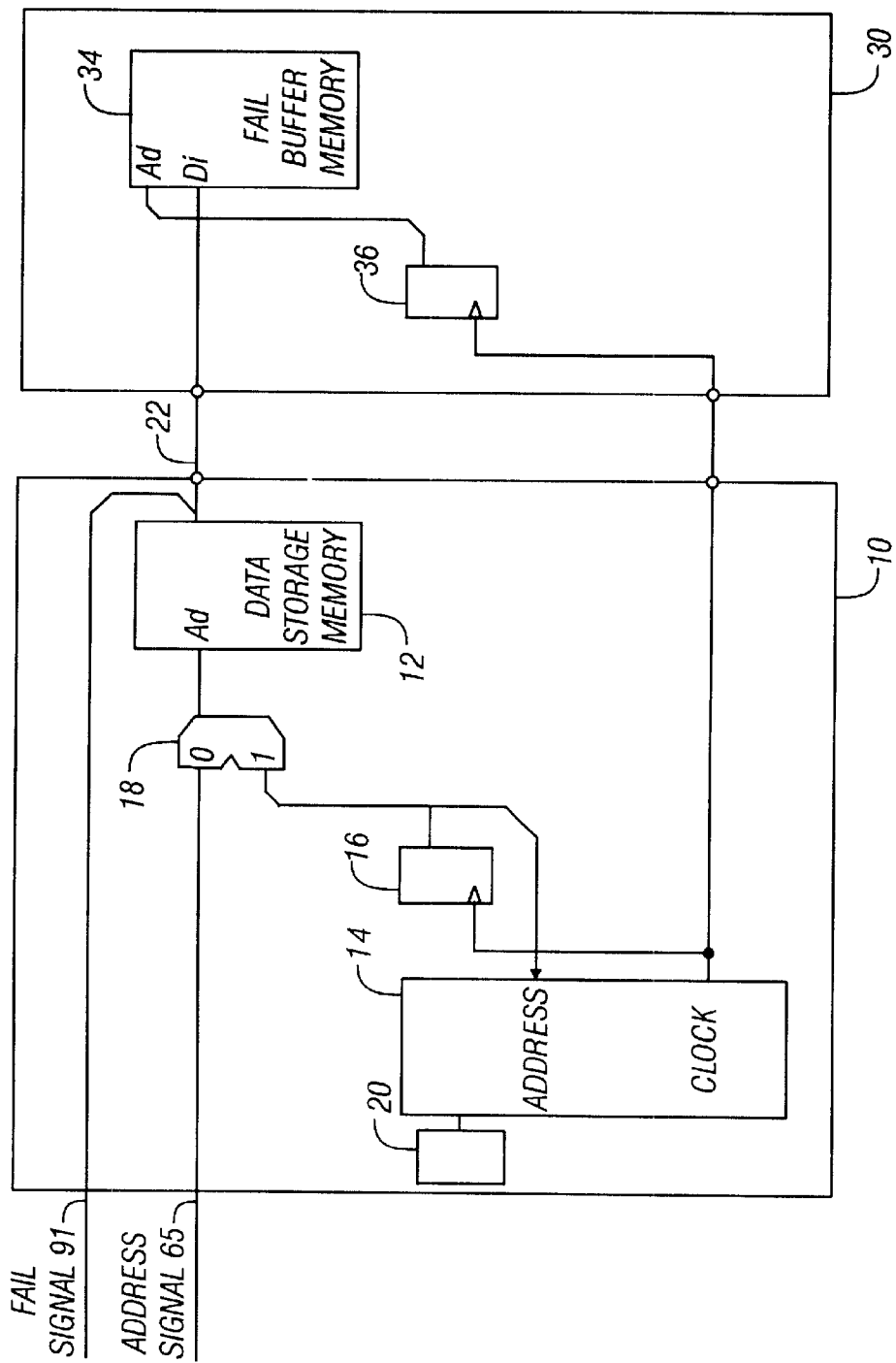
FIG. 1 is a block diagram showing a conventional configuration for transferring a fail signal stored in a failure analysis memory unit 10 to a memory failure remedy analysis unit 30 in a memory device testing apparatus to remedy a fail memory device.

When it is known that there is no failure information in a specific address region of the data storage memory 12 before transferring the data to the memory failure remedy analysis unit 200, the length of time required to transfer the failure information can be shortened if the specific address region can be skipped. The failure analysis memory unit 100 and the memory failure remedy analysis unit 200 are constructed as separate units that are connected with a cable. However, in order to skip the specific address region, the address signal must also be transmitted to the memory failure remedy analysis unit 200. For example, in order to skip the specific address region during the transfer using the failure analysis memory 10 and the memory failure remedy analysis unit 30 shown in FIG. 1, another cable for transmitting the address signal needs to be installed. The cable for transmitting the address signal is expensive. Therefore, if the number of cables for transmitting address signals is increased to transmit more signals, the overall installation cost is increased accordingly. In order to reduce the number of cables, no address signal is transmitted between the failure analysis memory unit 100 and the memory failure remedy analysis unit 200.

Figure 3:
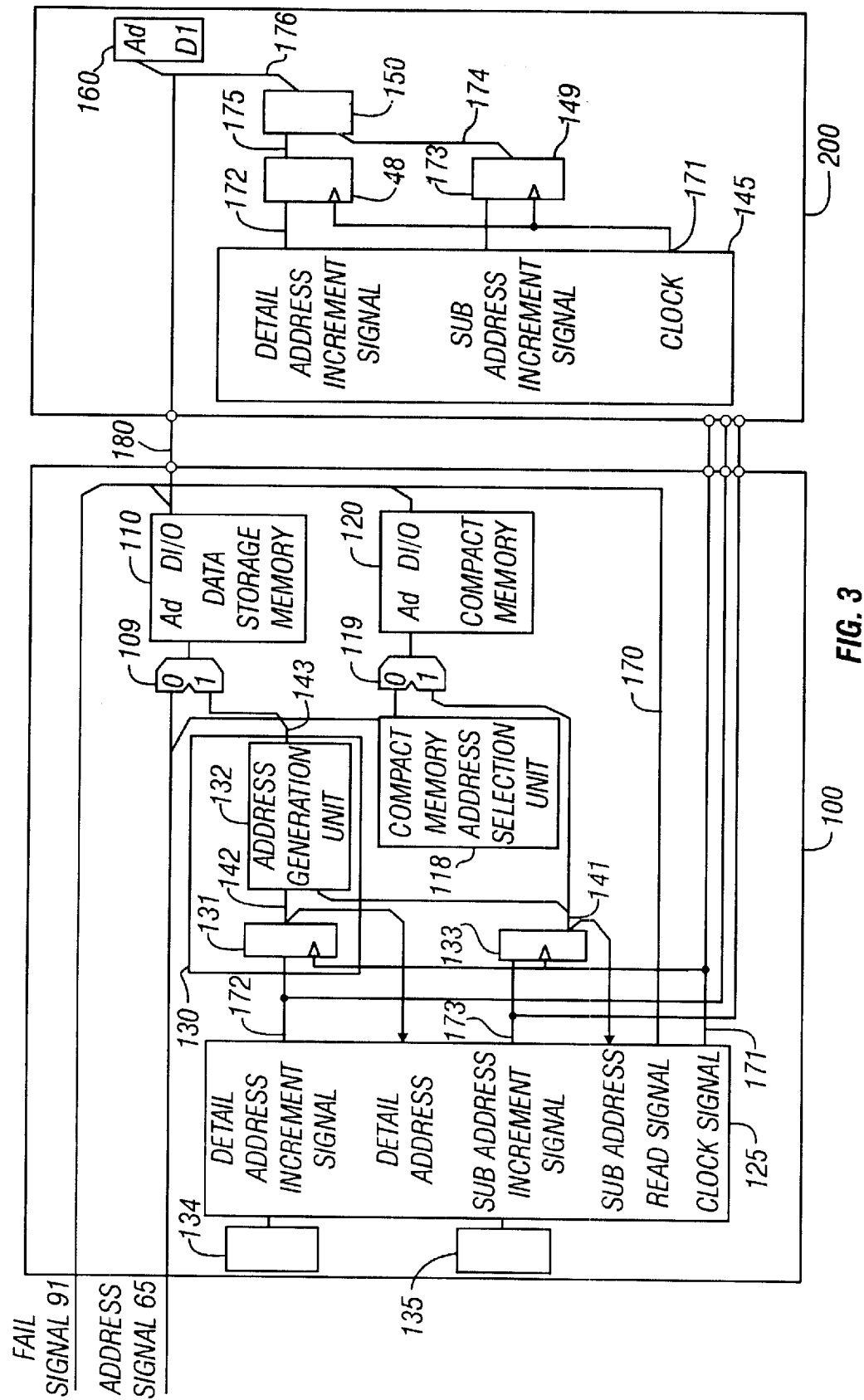
FIG. 3 is a block diagram showing the configuration of the present invention which transfers a fail signal from the failure analysis memory unit 100 to the memory failure remedy analysis unit 200.

FIG. 3 is a block diagram showing the detail configurations of the failure analysis memory unit 100 and the memory failure remedy analysis unit 200 of the present invention. The failure analysis memory unit 100 has a first multiplexer 109, a data storage memory 110, a compact memory address selection unit 118, a second multiplexer 119, a compact memory 120, an address generation control unit 125, a read address control unit 130, a partial memory address designation unit 133, a data storage memory register 134, and a compact memory register 135. The read address control unit 130 has a detail memory address designation unit 131 and an address generation unit 132. The memory failure remedy analysis unit 200 has an address generation control unit 145, a detail memory address designation unit 148, a sub memory address designation unit 149, an address generation unit 150, and a fail buffer memory 160.

The data storage memory 110 may have multiple memory devices. However, as a whole, the data storage memory 110 has the same number of words and the same bit width as the test memory device 81. For example, when the test memory device 81 is a 256M bit memory, the data storage memory 110 can be constituted of a single 256 M bit memory or four 64M bit memories. When a newly developed large capacity memory device 81 is tested, the data storage memory 110 may be constituted of multiple conventional small capacity memories.

The capacity of the compact memory 120 is very small compared with that of the data storage memory 110. When the fail signal 91 is written on the failure analysis memory unit 100 from the logic comparison device 90, the compact memory address selection unit 118 selects a portion of the bits of the address signal 65 that accesses the data storage memory 110, and outputs the selected portion of the bits of the address signal 65 to the compact memory 120.

The data storage memory register 134 stores the final address value of the sub address space of the data storage memory 110. When the data storage memory 110 is not divided into spaces of equal size, the data storage memory register 134 stores the end address value of each sub address space. The compact memory register 135 stores the final address value of the compact memory 120.

Figure 4:
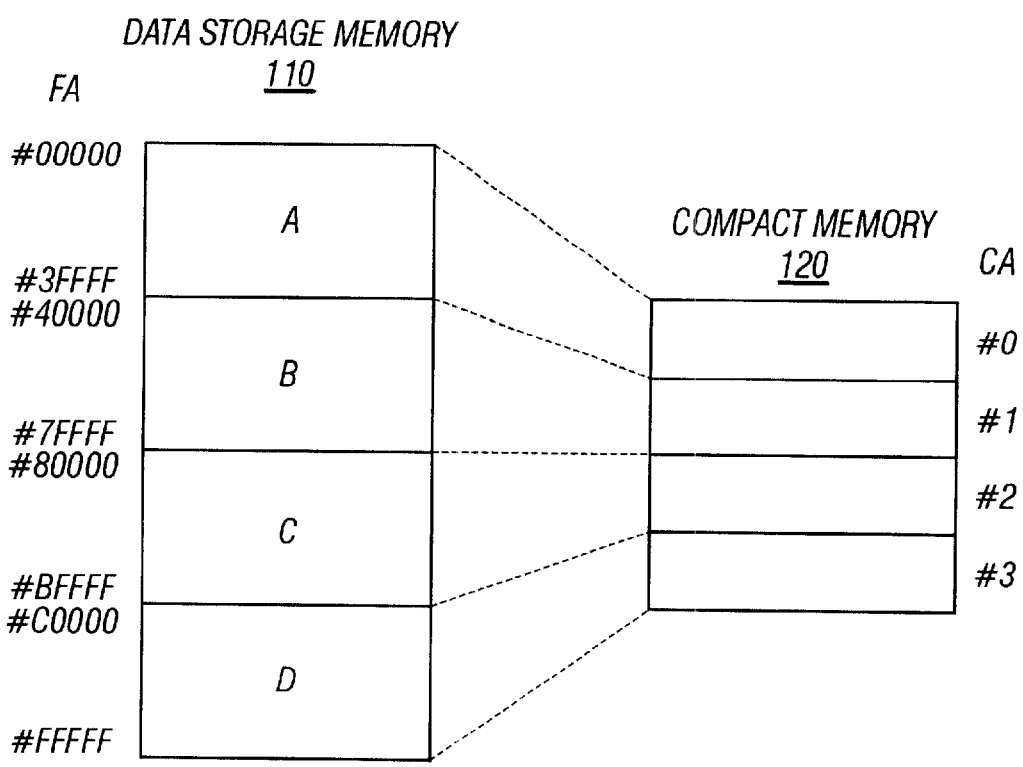
FIG. 4 shows an example in which the data storage memory 110 is divided into four sub address spaces (A through D) and each of the sub address spaces is assigned to one address of the compact memory 120.

FIG. 4 shows an example in which the data storage memory 110 is divided into four sub address spaces (A through D) and each of the sub address spaces is assigned to one address of the compact memory 120. This data storage memory 110 stores 1M words and has a bit width of 4. In the embodiment shown in FIG. 4, the address FA of the data storage memory 110 is set to FA0-19, and the address CA of the compact memory 120 is set to CA0-1. For example, by having the address CA0-1 correspond to the address FA18-19 of the data storage memory 110, the data storage memory 110 is divided into four sub address spaces A through D, and each of the four sub address spaces A through D is assigned to one address of the compact memory 120. That is, the sub address spaces FA#00000-3FFFF, #40000-7FFFF, #80000-BFFFF and #C0000-FFFFF of the data storage memory 110 are assigned to the address #0, #1, #2, and #3 of the compact memory 120, respectively. However, as another embodiment, the address CA0-1 of the compact memory 120 may be put in correspondence with arbitrary 2 bits of the address FA0-19.

To facilitate the understanding of the invention, the case in which a memory device 81 having the capacity of 1M words and bit width 4 is tested is considered. The operation in which the fail signal 91 output from the logic comparison device 90 is written onto the data storage memory 110 and compact memory 120 when the memory device 81 has a defective cell will be explained. The first multiplexer 109 and the second multiplexer 119 pre-select the input on the 0-side so that they can receive the address signal 65.

First, the operation for writing the fail signal 91 onto the data storage memory 110 will be explained. The address signal 65 passes through the first multiplexer 109 and is input to the data storage memory 110. In this embodiment, the data storage memory 110 has the same number of words 1M and the same bit width 4 as the test memory device 81. When the data storage memory 110 is composed of multiple memories, the upper address in the address signal 65 is decoded by a decoder (not shown in the drawing) into a chip selector signal which designates one memory. As a result, after the address of the data storage memory 110 has been designated, the fail signal 91 is written on the address of the data storage memory designated by the address signal 65.

Next, the operation for writing the fail signal 91 onto the compact memory 120 will be explained. The compact memory address selection unit 118 selects, for example, the upper 2 bits (FA18-19) of the address signal 65 and outputs the upper 2 bits to the second multiplexer 119. Therefore, the sub address spaces A through D of FA#00000-3FFFF, #40000-7FFFF, #80000-BFFFF and #C0000-FFFFF of the data storage memory 110 are assigned to the corresponding addresses #0, #1, #2, and #3 of the compact memory 120, respectively. A fail signal 91 generated from a certain sub address space is written on the corresponding address of the compact memory 120, and the compact memory 120 stores failure information which indicates that a defective spot exists in the corresponding sub address space. When the fail signal 91 is written, the compact memory 120 obtains the logic sum of the stored failure information and the fail signal 91, and holds the stored failure information.

The compact memory address selection unit 118 may select bits other than the upper 2 bits of the address signal 65. For example, the defective cells of the memory device tend to exist as a line error in which all the cells on a specific line become defective. Moreover, in some cases, it is known that very few defective cells exist in a particular address field. In such a case, it is desirable that the sub address space be determined so that the sub address space will be contained in a sub address space having the smallest number of defective cell addresses. Hence, the compact memory address selection unit 118 can select specific bits in the address signal 65 so that the defective cells will be contained in the smallest number of sub address spaces.

Figure 5:
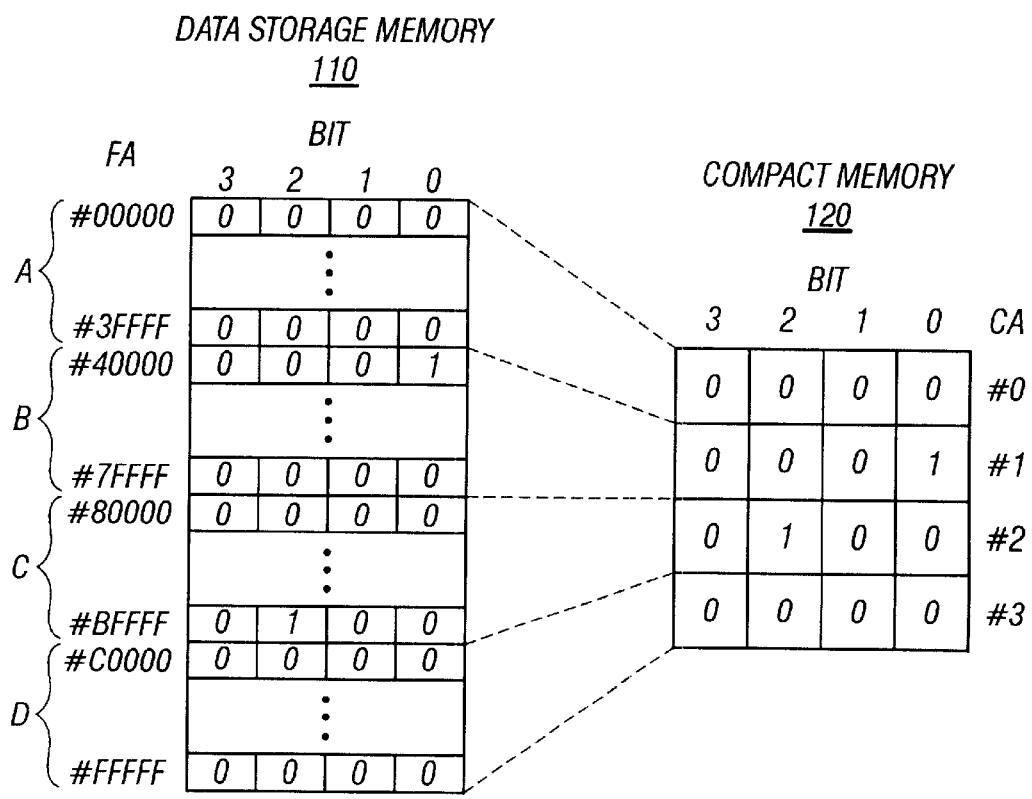
FIG. 5 shows a fail signal stored in the data storage memory 110 and exemplary fail information stored in the compact memory 120.

FIG. 5 shows a data storage memory 110 on which the fail signal 91 has been written as a result of testing the test memory device 81, and a compact memory 120 storing failure information which indicates the existence of defective spots in sub address spaces of data storage memory 110. In FIG. 5, "0" indicates that the comparison result in the logic comparison device 90 (FIG. 2) is in agreement, and "1" indicates that the comparison result in the logic comparison device 90 is in disagreement. According to this test result, the bit 0 in the address #40000 of the test memory device 81 and the bit 2 in the address #BFFFF are defective. Hence, failure information which indicates that defects exist in the bit 0 of the sub address space B and in the bit 2 of the sub address space C is written on the compact memory 120.

In what follows, the operation of each constitutive element when the data stored in the data storage memory 110 of the failure analysis memory unit 100 is transferred to the fail buffer memory 160 of the memory failure remedy analysis unit 200 will be explained. A clock signal 171, a detail address increment signal 172, a sub address increment signal 173 and a transfer data signal 180 are transmitted between the failure analysis memory unit 100 and the memory failure remedy analysis unit 200 so as to reduce the number of required cables. However, no address signal is transmitted between them.

The data storage memory register 134 and the compact memory register 135 store "3FFFF" and "3", respectively. The fail buffer memory 160 has the same capacity as the data storage memory 110. Before the data is transferred, the first multiplexer 109 and the second multiplexer are switched to the 1-side, and the sub memory address designation unit 133, the detail memory address designation unit 149, and the detail memory address designation unit 148 are set to the initial value 0.

The address generation control unit 125 reads 4-bit data stored in each address of the compact memory 120. First, the data stored in address #0 is read. All the data stored in address #0 of the compact memory 120 are "0". This indicates that no defective cell exists in the sub address space A of the data storage memory 110. Hence, the data in the sub address space A of the data storage memory 110 that corresponds to the address #0 of the compact memory is not transferred to the memory failure remedy analysis unit 200.

The address generation control unit 125 outputs a sub address increment signal 173 to the sub memory address designation unit 133. The sub memory address designation unit 133 counts the clock signal 171 based on the sub address increment signal 173, and outputs the incremented sub address signal 141 (value "#1"). Similarly, the sub memory address designation unit 149 counts another clock signal 171 that is substantially equal to the clock signal input to the sub memory address designation unit 133 based on the sub address increment signal 173, and generates a sub address signal 174 (value "#1") . The sub address signal 141 designated in the sub memory address designation unit 133 passes through the second multiplexer 119, and is input to the compact memory 120. In response to this sub address signal 141, the data stored in the address #1 of the compact memory 120 is read by the address generation control unit 125.

Stored in address #1 of the compact memory 120 shown in FIG. 5 is failure information which indicates that a defect exists in bit 0 of the data storage memory 10 in the sub address space B. The address generation control unit 125 controls the read address control unit 130 so as to generate the address of the sub address space B of the data storage memory 110. The read address control unit 130 has a detail memory address designation unit 131 and an address generation unit 132. The detail memory address designation unit 131 designates the address of the memory cell in the sub address space of the data storage memory 110. The address generation unit 132 selects a detail address signal 142 and a sub address signal 141 from the detail memory address designation unit 131 and the sub memory address designation unit 133, respectively, and generates a memory address signal 143 which accesses the data storage memory 110. Similarly, the address generation unit 150 selects a detail address signal 175 and a sub address signal 174 from the detail memory address designation unit 148 and the sub memory address designation unit 149, respectively, and generates a memory address signal 176 which accesses the fail buffer memory 160.

Figure 6:
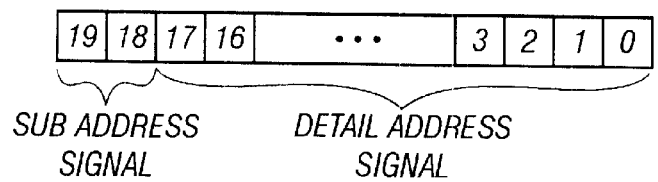
FIG. 6 shows a format of memory address signals generated by the address generation units 132 and 150, respectively.

FIG. 6 shows an exemplary format of the memory address signals 143 and 176 generated by the address generation units 132 and 150, respectively. The address generation units 132 and 150 form formats of the memory address signals 143 and 176, respectively, based on the bits selected by the compact memory address selection unit 118. In this example, the detail address signals 142 and 175 (value "#0") output from the detail memory address designation units 131 and 148, respectively, are assigned to address FA0-17, and the sub address signals 141 and 174 (value "#1") output from the sub memory address designation units 133 and 149, respectively, are assigned to address FA18-19. The binary representation of the generated address is #01000000000000000000, and the hexadecimal representation of the generated address is #40000.

It can be seen that this address is the start address of the sub address space B.

The memory address signal 143 generated by the address generation unit 132 is input to the data storage memory 110. The data (0001) stored at the address #40000 is read from the data storage memory 110 and is transferred to the memory failure remedy analysis unit 200. The transfer data signal 180 to be transferred is written on the address in the fail buffer memory 160 designated by the memory address signal 176. The address generation control unit 125 compares the detail address signal 142 (value "#0") designated by the detail memory address designation unit 131 with the value "3FFFF" stored in the data storage memory register 134. If the detail address signal 142 does not match the value "3FFFF" stored in the data storage memory register 134, the value of the detail address signal 142 is incremented based on the detail address increment signal 172 and the clock signal 171. Similarly, the value of the detail address signal 175 is incremented based on the detail address increment signal 172 and the clock signal 171. After this, the address generation unit 132 reads the detail address signal 142 (value "#1") and the sub address signal 141 (value "#1"), and generates a memory address signal 143 that accesses the data storage memory 110. Similarly, the address generation unit 150 reads the detail address signal 175 (value "#1") and the sub address signal 174 (value "#1"), and generates a memory address signal 176 that accesses the fail buffer memory 160. In this case, the binary representation of the generated address is #01000000000000000001, and the hexadecimal representation of the generated address is #40001. This operation is repeated until all the data stored in the sub address space B is transferred.

After the detail memory address designation unit 131 has designated "3FFFF" and the data stored in the address #7FFFF of the data storage memory 110 has been transferred to the fail buffer memory 160, the value "3FFFF" of the detail address signal 142 is compared with the value "3FFFF" stored in the data storage memory register 134. If the value of the detail address signal 142 agrees with the value stored in the data storage memory register 134, the agreement means that all the data stored in the sub address space B has been transferred. After all the data stored in the sub address space B has been transferred, preparation for transferring the data stored in the next sub address space C is started.

The value "1" of the sub address signal 141 designated by the sub memory address designation unit 133 is compared with the value "3" stored in the compact memory register 135. If the value "1" of the sub address signal 141 does not agree with the value stored in the compact memory register 135, the value of the sub address signal 141 is incremented based on the sub address increment signal 173 and the clock signal 171. Similarly, the value of the sub address signal 174 is incremented based on the sub address increment signal 173 and the clock signal 171. Therefore, the values of the sub address signals 141 and 174 become "2". Moreover, the detail address signals 142 and 175 are reset to "0". After this, the above-described transfer operation is performed for the sub address space C.

The sub memory address designation unit 133 designates the value"2", and the sub address signal 141 (value "#2") passes through the second multiplexer 119 and is input to the compact memory 120. Failure information which indicates that a defect exists in bit 2 of the sub address space C is stored in address #2 of the compact memory 120. The address generation control unit 125 reads the data (0100) stored in address #2. Since the sub address space C has a defective cell, all the data stored in the sub address space C is transferred as in the case of the sub address space B.

After all the data stored in the sub address space C has been transferred, the value #2 of the sub address signal 141 is compared with the value "3" stored in the compact memory register 135. Since the value of the sub address signal 141 still does not agree with the value stored in the compact memory register 135, the values of the sub address signals 141 and 174 are incremented based on the sub address increment signal 173 and the clock signal 171. Therefore, the sub address signals 141 and 174 are set to value "#3". Moreover, the detail address signals 142 and 175 are reset to "0". After this, the above-described transfer operation is performed for the sub address space D.

The submemory address designation unit 133 designates value 11311, and the sub address signal 141 (value "#3") passes through the second multiplexer 119 and is input to the compact memory 120. Failure information, which indicates that a defective cell exists, is not stored in address #3 of the compact memory 120. Therefore, the data stored in the sub address space D is not transferred.

Next, the value #3 of the sub address signal 141 is compared with the value "3" stored in the compact memory register 135. The value of the sub address signal 141 agrees with the value stored in the compact memory register 135. This shows that all the fail signals in all the sub memory addresses have been transferred. The transfer operation of the failure analysis memory unit 100 ends when the value of the sub address signal 141 designated by the submemory address designation unit 133 agrees with the value stored in the compact memory register 135.

Figure 7:
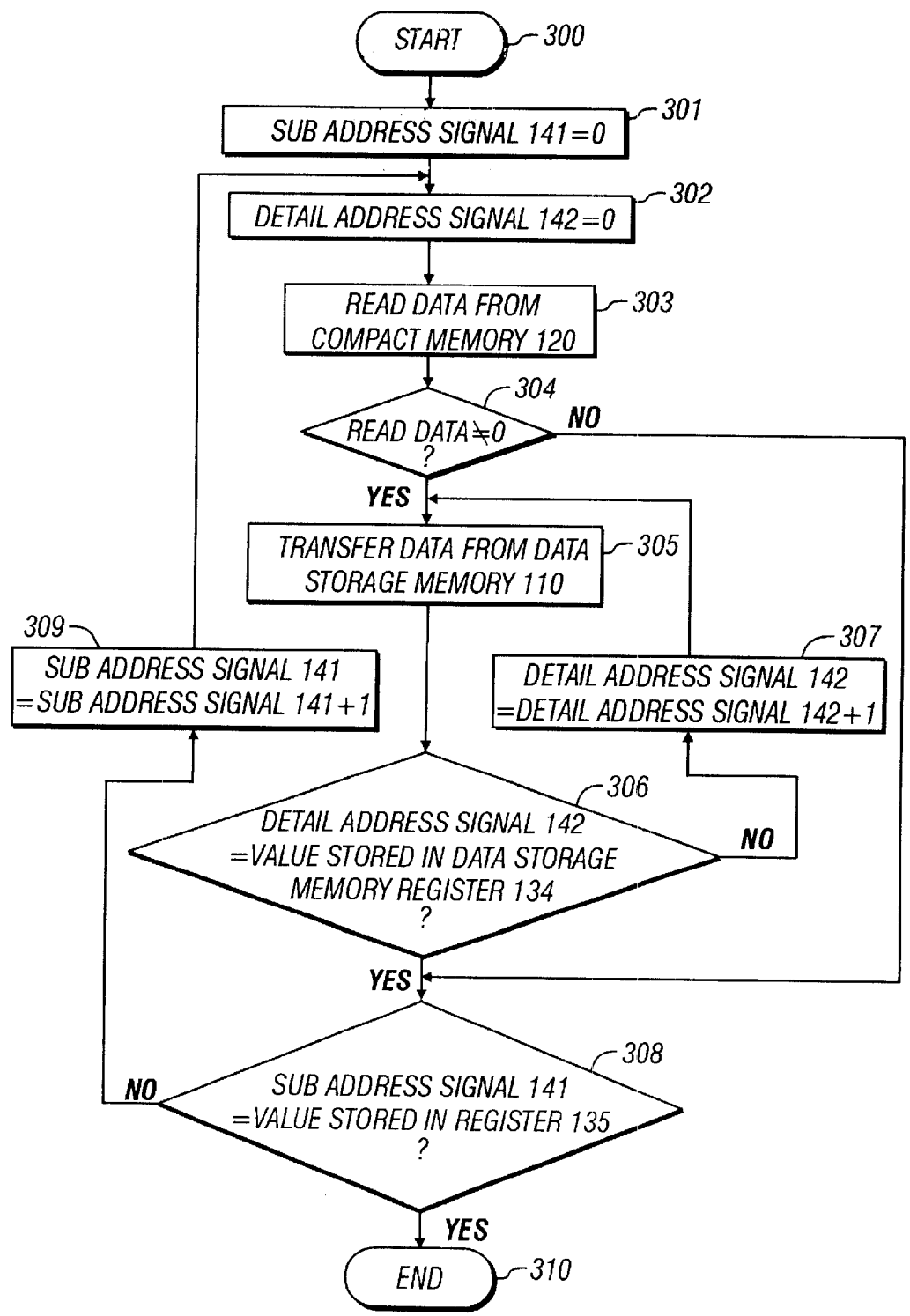
FIG. 7 is a data transfer flow chart of the present invention.

FIG. 7 is a flow chart for the fail signal transfer explained with reference to FIG. 3. The transfer step of the present invention is started at step 300. In step 301, the sub address signal 141 is set to "0". In step 302, the detail address signal 142 is set to "0". In step 303, the data stored in the compact memory 120 is read based on the sub address signal 141. In step 304, it is checked whether the read data is 0 or not.

When the read data is not 0 in step 304, it is shown that a fail signal is stored in a sub address space in the data storage memory 110 that corresponds to the address of the checked compact memory 120. The transfer step proceeds to the data transfer sequence. The data transfer sequence consists of steps 305 through 307. In step 305, the data stored in the first address of the sub address space is read and transferred. In step 306, the value of the detail address signal 142 is compared with the end address value of the sub address space stored in the data storage memory register 134. If the two values do not match, the transfer step proceeds to step 307. In step 307, the detail address signal 142 is incremented, and this data transfer sequence returns to step 305 in order to transfer the data stored in the next address. This data transfer sequence is repeated until all the data stored in the sub address space has been transferred. In step 306, if the value of the detail address signal 142 matches the end address value of the sub address space stored in the data storage memory register 134, the transfer step proceeds to step 308.

In step 304, when the read data is 0, it is indicated that a fail signal is not stored in the sub address space in the data storage memory 110 that corresponds to the address of the checked compact memory 120. Therefore, the data stored in this sub address space is not transferred, and the step proceeds to step 308.

In step 308, the value of the sub address signal 141 is compared with the end address value of the compact memory 120 stored in the compact memory register 135. If the two values do not match, the transfer step proceeds to step 309, in which the sub address signal 141 is incremented. After this, the transfer step returns to step 302, and the next sub address space is checked.

In step 308, if the value of the sub address signal 141 agrees with the end address value of the compact memory 120 stored in the compact memory register 135, the transfer step proceeds to step 310 and ends.

Once all the fail signals stored in the data storage memory 110 have been transferred to the fail buffer memory 160, the detail memory address designation unit 131, the sub memory address designation unit 133, the detail memory address designation unit 148, and the sub memory address designation unit 149 are all set to the initial value 0 so as to test the next memory device. The data transferred to the fail buffer memory 160 is used later for remedy analysis.

According to the present invention, high-speed data transfer is achieved by transferring only the data stored in sub address spaces having failure information.

What is claimed is:

1. A data transfer apparatus which transfers data from a data storage memory divisible into at least two sub address spaces, comprising:

a compact memory for storing transfer data existence information which indicates whether transfer data to be transferred exists or not in each of said sub address spaces;

a sub memory address designation unit for generating a sub address signal that designates said sub address space having said transfer data based on an output from said compact memory; and a read address control unit which reads and transfers said transfer data stored in said sub address space indicated by said sub address signal output from said sub memory address designation unit.

2. A data transfer apparatus as claimed in claim 1, wherein said read address control unit has a detail memory address designation unit for generating a detail address signal that designates a memory position of said transfer data stored in said sub address space.

3. A data transfer apparatus as claimed in claim 2, wherein said read address control unit has an address generation unit for generating a memory address signal that accesses said data storage memory based on said sub address signal output from said sub memory address designation unit and said detail address signal output from said detail memory address designation unit.

4. A data transfer apparatus as claimed in claim 3, wherein said address generation unit sets said sub address signal output from said sub memory address designation unit to a bit of said memory address signal.

5. A data transfer apparatus as claimed in claim 3, wherein said address generation unit generates said memory address signal that accesses said data storage memory using said sub address signal output from said sub memory address designation unit as an upper bit of said detail address signal output from said detail memory address.

6. A data transfer method for transferring data from a data storage memory divisible into at least two sub address spaces, comprising:

a step of storing in a compact memory having a memory capacity smaller than a memory capacity of said data storage memory transfer data existence information which indicates whether transfer data to be transferred exists or not in each of said sub address spaces;

a step of generating a sub address signal for designating said sub address space in which said transfer data is stored based on said transfer data existence information stored in said compact memory; and a step of reading and transferring said transfer data stored in said sub address space designated by said generated sub address signal.

7. A data transfer method as claimed in claim 6, wherein said step of transferring said transfer data has a step of generating a detail address signal which designates a memory position of said transfer date in said sub address space.

8. A data transfer method as claimed in claim 7, wherein said step of transferring said transfer data has a step of generating a memory address signal for accessing said data storage memory based on said sub address signal and said detail address signal.

9. A data transfer method as claimed in claim 8, wherein said step of transferring said transfer data further has a step of setting said sub address signal to a bit of said memory address signal.

10. A data transfer method as claimed in claim 8, wherein said step of transferring said transfer data further has a step of generating said memory address signal for accessing said data storage memory using said sub address signal as an upper bit of said detail address signal.

\* \* \* \* \*